US012796163B2

(12) United States Patent
Tao et al.

(10) Patent No.: US 12,796,163 B2
(45) Date of Patent: Nov. 10, 2026

(54) PHOTOVOLTAIC MODULE, METHOD FOR FORMING THE SAME AND PROCESSING SYSTEM

(71) Applicants: JINKO SOLAR CO., LTD., Jiangxi (CN); ZHEJIANG JINKO SOLAR CO., LTD., Haining (CN)

(72) Inventors: Wusong Tao, Jiangxi (CN); Zhendong Chen, Jiangxi (CN); Yunfeng Zhou, Jiangxi (CN)

(73) Assignees: JINKO SOLAR CO., LTD., Jiangxi (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 19/006,307

(22) Filed: Dec. 31, 2024

(65) Prior Publication Data

US 2026/0059902 A1 Feb. 26, 2026

(30) Foreign Application Priority Data

Aug. 20, 2024 (CN) ......................... 202411142574.2
Aug. 20, 2024 (CN) ......................... 202411142722.0

(51) Int. Cl.
*H10F 77/00* (2025.01)

(52) U.S. Cl.
CPC ................................. *H10F 77/937* (2025.01)

(58) Field of Classification Search
None
See application file for complete search history.

(56) References Cited

U.S. PATENT DOCUMENTS

2023/0006073 A1 1/2023 Xi et al.
2024/0363780 A1* 10/2024 Blankemeyer ........ H10F 19/904

FOREIGN PATENT DOCUMENTS

CN 201036230 Y 3/2008
CN 109980035 A 7/2019
CN 210403751 U 4/2020
CN 210816840 U 6/2020
CN 111613685 A 9/2020
CN 114649435 A 6/2022
(Continued)

OTHER PUBLICATIONS

European Search Report issued in corresponding EP Application 25151212.5, issued May 19, 2025 (10 pages).
(Continued)

*Primary Examiner* — Dustin Q Dam
(74) *Attorney, Agent, or Firm* — Burris Law, PLLC

(57) ABSTRACT

Provided is a photovoltaic module, including a cell string, a bus bar, and at least one solder strip configured to connect the bus bar to a cell of the cell string. Along a thickness direction of the photovoltaic module, the bus bar is located at a side where a back surface of the cell is located, and at least part of a projection of the bus bar along the thickness direction Z of the photovoltaic module is located within a projection of the cell string. The solder strip includes a connecting section and a bending section, the connecting section is connected to the cell, the bending section bends towards the side where the back surface of the cell is located and is connected to the bus bar, and an extension direction of the bending section is not parallel to an extension direction of the connecting section.

19 Claims, 10 Drawing Sheets

(56) References Cited

FOREIGN PATENT DOCUMENTS

| | | | | | |
|---|---|---|---|---|---|
| CN | 116053329 | A | | 5/2023 | |
| CN | 116705885 | A | | 9/2023 | |
| CN | 117878163 | A | | 4/2024 | |
| JP | 2005123445 | A | * | 5/2005 | ........... H10F 77/937 |
| KR | 20210087245 | A | | 7/2021 | |
| WO | 2022258361 | A1 | | 12/2022 | |
| WO | 2023052016 | A1 | | 4/2023 | |
| WO | 2023185003 | A1 | | 10/2023 | |

OTHER PUBLICATIONS

Search Report.
Patent Search Report (4 pages).
Chinese Office Action mailed Nov. 21, 2025, issued in related Chinese Application No. 202411142722.0 (14 pages).
Chinese Grant of Patent for Application No. 202411142574.2, mailed Nov. 11, 2025 (8 pages).

* cited by examiner

PHOTOVOLTAIC MODULE, METHOD FOR FORMING THE SAME AND PROCESSING SYSTEM

CROSS-REFERENCE TO RELATED APPLICATIONS

The present application claims priority to Chinese Application No. 202411142574.2, and Chinese Application No. 202411142722.0, which were filed on Aug. 20, 2024, and the contents of which are incorporated herein by reference in their entireties.

FIELD

The present disclosure relates to the technical field of solar cells, and in particular, to a photovoltaic module.

BACKGROUND

The statements in this section merely provide background information related to the present disclosure and may not constitute prior art.

With development of the technology, an application range of a photovoltaic module has become more and more extensive. The photovoltaic module includes a bus bar and a cell. Generally, the bus bar is arranged, along a length direction of the photovoltaic module, at two opposite sides of a cell string formed by cells. Through this design, the bus bar is required to occupy a certain space in the length direction of the photovoltaic module, which affects layout of the cell, resulting in a relatively low area proportion of the cell and affecting efficiency of a photovoltaic cell.

SUMMARY

This section provides a general summary of the disclosure and is not a comprehensive disclosure of its full scope or all of its features.

In view of this, the present disclosure provides a photovoltaic module to help solve the problem of the relatively low area proportion of the cell in the prior art.

Some embodiments of the present disclosure provide a photovoltaic module, including: a cell string, a bus bar, and at least one solder strip. The cell string includes a cell, and the solder strip is configured to connect the cell to the bus bar. Along a thickness direction of the photovoltaic module, the bus bar is located at a side where a back surface of the cell is located; and at least part of a projection of the bus bar along the thickness direction of the photovoltaic module is located within a projection of the cell string along the thickness direction of the photovoltaic module; and the solder strip includes a connecting section and a bending section connected to each other; the connecting section is connected to the cell, the bending section bends towards the side where the back surface of the cell is located and is connected to the bus bar, and an extension direction of the bending section is not parallel to an extension direction of the connecting section.

In a possible design, an angle is formed between the extension direction of the bending section and the extension direction of the connecting section, and the angle ranges from 5° to 25°.

In a possible design, the cell includes a plurality of solder spots, and along a length direction of the photovoltaic module, the solder spot closest to the bus bar is defined as a first solder spot, and the connecting section and the bending section are located at two opposite sides of the first solder spot; and the bending section includes a first bending section and a second bending section connected to each other, the first bending section is connected to the connecting section, and the second bending section is connected to the bus bar.

In a possible design, the connecting section and the second bending section of a same solder strip are located at a same side of the cell string, or the connecting section and the second bending section of a same solder strip are located at different sides of the cell string.

In a possible design, along the thickness direction of the photovoltaic module, the second bending section is located at a side of the bus bar facing the cell string; or along the thickness direction of the photovoltaic module, the second bending section is located at a side of the bus bar away from the cell string.

In a possible design, along a length direction of the photovoltaic module, at least part of the bending section exceeds an edge of the cell string by a distance L1 ranging from 0.1 mm to 2 mm.

In a possible design, along a length direction of the photovoltaic module, the bus bar does not exceed an edge of the cell string.

In a possible design, the photovoltaic module further includes an isolation member, and along the thickness direction of the photovoltaic module, the isolation member is located between the bus bar and the cell.

In a possible design, the isolation member includes an insulating portion and a cushioning portion, and along the thickness direction of the photovoltaic module, the insulating portion and the cushioning portion are arranged in sequence.

In a possible design, along the thickness direction of the photovoltaic module, the insulating portion is located at a side of the cushioning portion facing the bus bar.

Some embodiments of the present disclosure provide a method for forming the photovoltaic module described above, and the method for forming the photovoltaic module is implemented by a processing system for a photovoltaic module, the processing system includes a main body, a pick-and-place mechanism, and a flipping mechanism; and the method for forming the photovoltaic module includes: placing the cell string on the main body, the cell string being connected to the bus bar; placing, by the pick-and-place mechanism, a limiting tool on the cell string, part of the limiting tool protruding from a first edge, and the first edge being an edge of the cell string facing the bus bar; clamping, by the flipping mechanism, the bus bar and flipping the bus bar relative to the limiting tool; unclamping, by the flipping mechanism, the bus bar; and removing, by the pick-and-place mechanism, the limiting tool from the cell string.

In a possible design, the cell string includes a cell and a solder strip, and the solder strip is connected to the cell and the bus bar; and in the step of clamping, by the flipping mechanism, the bus bar and flipping the bus bar relative to the limiting tool, at least part of the solder strip protruding from the first edge is bent to be formed as an arc shape.

In a possible design, a length L4 by which the limiting tool protrudes from the first edge satisfies: 0.1 mm≤L4≤1.5 mm.

In a possible design, a width L5 of the limiting tool satisfies: 4 mm≤L5≤18 mm.

In a possible design, a difference between the width L5 of the limiting tool and a width L6 of the bus bar satisfies: L5−L6≥1 mm.

In a possible design, the limiting tool limits one cell string or a plurality of cell strings.

In a possible design, the processing system further includes a placement mechanism; and subsequent to the step of removing, by the pick-and-place mechanism, the limiting tool from the cell string, or prior to the step of placing, by the pick-and-place mechanism, a limiting tool on the cell string, the method for forming the photovoltaic module further includes: placing, by the placement mechanism, an isolation member on the cell string, to make the isolation member be located between the bus bar and the cell string.

In a possible design, a width L7 of the isolation member is greater than a width L6 of the bus bar.

In a possible design, a width L7 of the isolation member satisfies: 4 mm≤L7≤20 mm.

Some embodiments of the present disclosure provide a processing system for a photovoltaic module, the processing system is used for implementing the method for forming the photovoltaic module, and the processing system includes: a main body, a pick-and-place mechanism, a flipping mechanism, a placement mechanism, and a control unit. The main body is configured to place the cell string, and the control unit controls operations of the pick-and-place mechanism, the flipping mechanism, and the placement mechanism.

The present disclosure provides a photovoltaic module. The photovoltaic module includes a cell string, a bus bar, and at least one solder strip configured to connect the bus bar to a cell of the cell string. Along a thickness direction of the photovoltaic module, the bus bar is located at a side where a back surface of the cell is located. At least part of a projection of the bus bar along the thickness direction of the photovoltaic module is located within a projection of the cell string along the thickness direction of the photovoltaic module. The solder strip includes a connecting section and a bending section, the connecting section is connected to the cell, the bending section bends towards the side where the back surface of the cell is located and is connected to the bus bar, and an extension direction of the bending section is not parallel to an extension direction of the connecting section. Through this design, the bus bar can be arranged at a back side of the cell, thereby reducing a space occupied by the bus bar in a length direction of the photovoltaic module, thus helping to improve an area proportion of the cell and helping to improve efficiency of the photovoltaic module.

It should be understood that the general description above and the detailed description in the following are merely exemplary and cannot limit the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
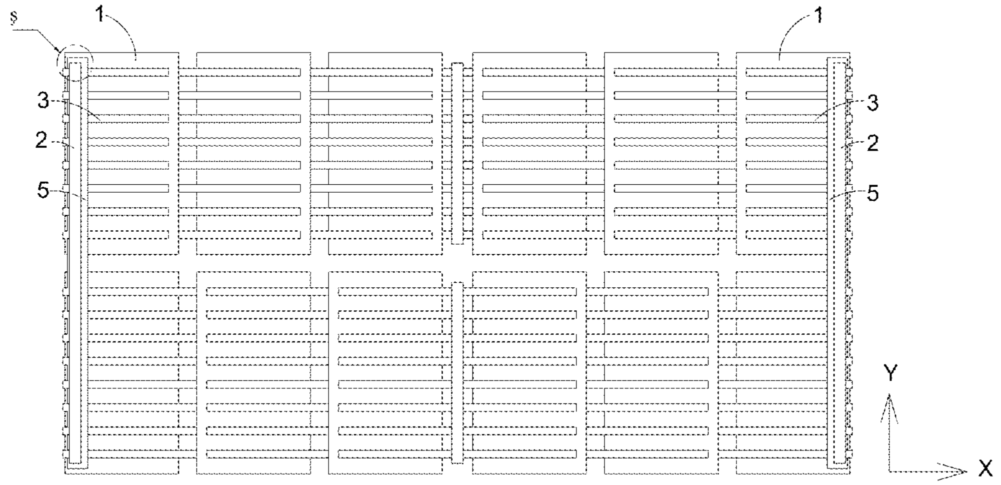
FIG. 1 is a schematic diagram of a photovoltaic module according to some embodiments of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better illustrate the technical solutions of the present disclosure, the embodiments of the present disclosure are described in detail in combination with the accompanying drawings.

It should be made clear that the embodiments described are only some of rather than all of the embodiments of the present disclosure. All other embodiments acquired by those of ordinary skill in the art without creative efforts based on the embodiments of the present disclosure shall fall within the protection scope of the present disclosure.

The terms used in the embodiments of the present disclosure are for the purpose of describing specific embodiments only and are not intended to limit the present disclosure. As used in the specification of the present disclosure and the appended claims, the singular forms of "a/an", "one", and "the" are also intended to include plural forms, unless otherwise clearly specified in the context.

It should be understood that the term "and/or" used herein describes an association relationship between associated objects and represents that three relationships may exist. For example, A and/or B may represent the following three cases: only A exists, both A and B exist, and only B exists. In addition, the character "/" herein generally indicates an "or" relationship between the associated objects.

Figure 2:
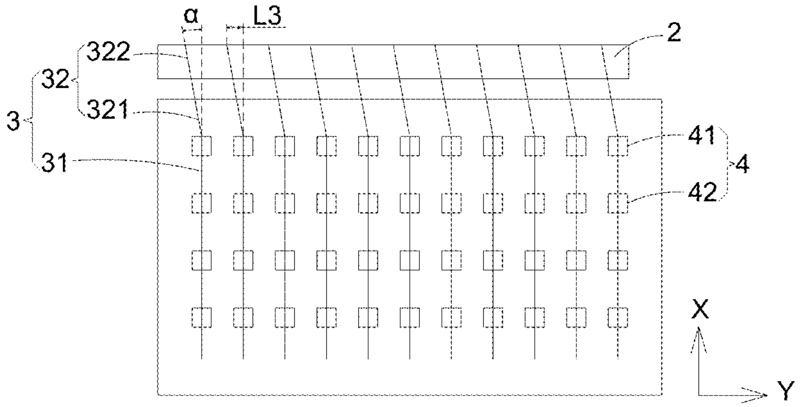
FIG. 2 is a schematic expanded view of a photovoltaic module according to some embodiments of the present disclosure.

As shown in FIG. 1, some embodiments of the present disclosure provide a photovoltaic module. The photovoltaic module includes at least one cell string, at least one bus bar 2, and at least one solder strip 3. The cell string includes at least one cell 1. A number of the cell(s) 1 may be selected according to a size of the photovoltaic module. Adjacent cells 1 may be connected together by connecting members such as solder wires. The cells 1 of a same cell string are arranged along a length direction X of the photovoltaic module. The cell strings may be arranged along the length direction X or a width direction of the photovoltaic module, respectively. The bus bar 2 may generally be made of a material such as silver, aluminum, or copper and is configured to achieve effects such as electric conduction and shunt. The bus bar 2 is connected to the cell 1 of the cell string through the solder strip 3. Along a thickness direction Z of the photovoltaic module, the bus bar 2 is located at a side where a back surface of the cell 1 is located. At the same time, at least part of a projection of the bus bar 2 along the thickness direction Z of the photovoltaic module may be located within a projection of the cell string along the thickness direction Z of the photovoltaic module. As shown in FIG. 2, the solder strip 3 includes a connecting section 31 and a bending section 32. The connecting section 31 and the bending section 32 are connected to each other. The connecting section 31 is configured to be connected to the cell 1 of the cell string. The bending section 32 bends towards the side where the back surface of the cell 1 is located and is connected to the bus bar 2, and an extension direction of the bending section 32 is not parallel to an extension direction of the connecting section 31.

By arranging the bus bar 2 at the back side of the cell 1, at least part of the bus bar 2 overlaps with the cell string in the thickness direction Z of the photovoltaic module. When calculating a space occupied by the bus bar 2 in the length direction X of the photovoltaic module, an overlapping part between the bus bar 2 and the cell string can be ignored. Therefore, the space occupied by the bus bar 2 in the length direction X of the photovoltaic module can be reduced. When a dimension of the photovoltaic module in the length direction X is unchanged, a dimension occupied by the bus bar 2 in the length direction X is reduced. Therefore, more space can be reserved for the arrangement of the cell 1, which can increase an area proportion of the cell 1 in the photovoltaic module, thereby helping to improve conversion efficiency of the photovoltaic module. At the same time, folding the bus bar 2 towards the back surface of the cell 1 can reduce a possibility of blocking the cell 1 by the bus bar 2, which can further improve the efficiency of the photovoltaic module. The extension direction of the bending section 32 is not parallel to the extension direction of the connecting section 31, so that the bending section 32 may be misaligned with the connecting section 31 after bending, thereby reducing a possibility of overlapping between the bending section 32 and the connecting section 31 in the thickness direction Z of the photovoltaic module, so as to reduce a possibility of hidden cracks during lamination of the photovoltaic module.

The bus bar 2 may be bent to the side where the back surface of the cell 1 is located after soldering with the solder strip 3, or the bus bar 2 may be arranged directly at the side where the back surface of the cell 1 is located and then soldered by the solder strip 3. That is, the solder strip 3 and the bus bar 2 may be soldered first and then folded, or the position of the bus bar 2 may be set first and then soldering is performed. Specific processing steps may be selected according to an actual situation.

Figure 3:
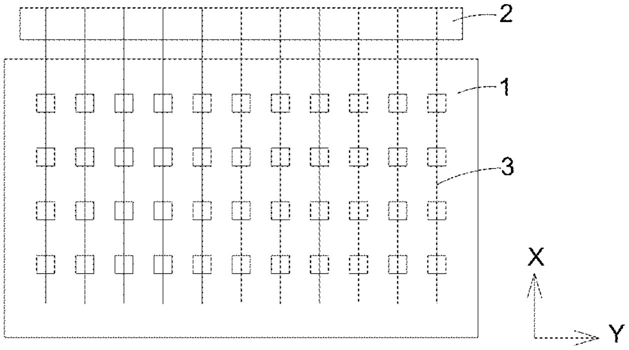
FIG. 3 is a schematic expanded view of a photovoltaic module according to some embodiments of the present disclosure.
Figure 4:
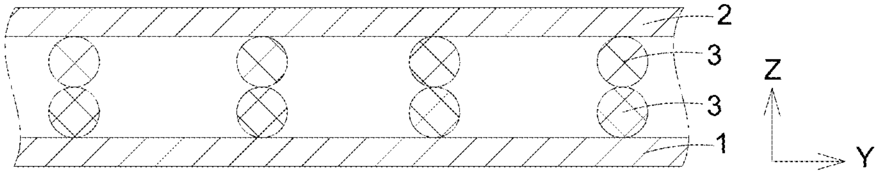
FIG. 4 is a schematic cross-sectional view of a photovoltaic module according to some embodiments of the present disclosure.

FIG. 3 and FIG. 4 show a solution in which the bending section 32 and the connecting section 31 are not misaligned. After the bus bar 2 is folded to the back surface of the cell 1, along the thickness direction Z of the photovoltaic module, there is an overlapping region between the bending section 32 and the connecting section 31 of the same solder strip 3. In this way, a distance between the bus bar 2 and the cell 1 is increased. As a result, a thickness of a local position of the photovoltaic module increases, and during the lamination, stress at the corresponding position increases, which is prone to a risk of hidden cracks, thereby affecting the quality of the photovoltaic module.

Figure 5:
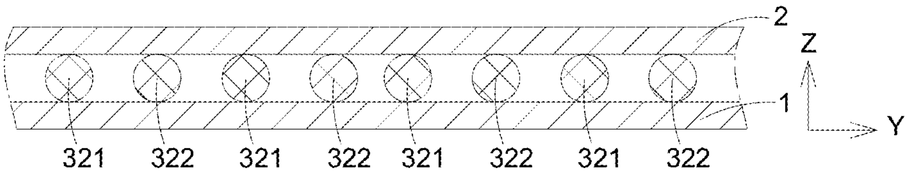
FIG. 5 is a schematic cross-sectional view of a photovoltaic module according to some embodiments of the present disclosure.

FIG. 2 and FIG. 5 show a solution in which the bending section 32 and the connecting section 31 are misaligned. FIG. 2 is a schematic diagram of an unfolded state, that is, prior to bending the solder strip 3. A state of the bus bar 2 after folding is shown in FIG. 5. FIG. 5 is a schematic cross-sectional view of a photovoltaic module after folding the bus bar. The bending section 32 and the connecting section 31 of the solder strip 3 are misaligned, so that after the bus bar 2 is folded, the bending section 32 and the connecting section 31 of the solder strip 3 do not coincide, which helps to reduce the distance between the bus bar 2 and the cell 1 and reduce the thickness of the corresponding region, thereby helping to reduce the stress at the region during the lamination, reduce the risk of hidden cracks, reduce a possibility of damage to the photovoltaic module, and improve the quality of the photovoltaic module.

According to the solution provided in some embodiments of the present disclosure, by folding the bus bar 2 to the back surface of the cell 1 and misaligning the solder strip 3, the space occupied by the bus bar 2 in the length direction X of the photovoltaic module can be reduced so that the photovoltaic module can have more space to arrange the cell 1, and the area proportion of the cell 1 can be increased to improve the efficiency of the photovoltaic module. At the same time, by bending the solder strip 3 in a misaligned manner, the thickness of the photovoltaic module can be reduced, and then a height difference between the bus bar 2 and the cell 1 can be reduced, thereby reducing a possibility of stress concentration, which helps to reduce the possibility of hidden cracks in the photovoltaic module during the lamination, improves the quality of the photovoltaic module, and increases a yield thereof.

It is to be noted herein that the bus bar 2 as referred to in the solution provided in some embodiments of the present disclosure may be a bus bar located at each of two ends of the photovoltaic module, i.e., a first bus bar and a last bus bar; or may be a middle bus bar located between the first bus bar and last bus bar along the length direction X of the photovoltaic module.

As shown in FIG. 2, in some embodiments, an angle $\alpha$ is formed between the extension direction of the bending section 32 and the extension direction of the connecting section 31, and the angle $\alpha$ ranges from 5° to 25°. The angle $\alpha$ may be 5°, 7°, 9°, 11°, 13°, 15°, 17°, 19°, 21°, 23°, 25°, or the like. The angle $\alpha$ between the extension direction of the bending section 32 and the extension direction of the connecting section 31 may be an appropriate angle selected within the range of 5° to 25° according to a situation. The angle $\alpha$ herein generally refers to an angle between the extension direction of the bending section 32 and the extension direction of the connecting section 31 before the solder strip 3 is folded.

Through this design, the solder strip 3 can be misaligned after folding, reducing a possibility of overlapping of the solder strip 3. When the angle is less than 5°, an inclination angle of the bending section 32 relative to the connecting section 31 is smaller, and the solder strip 3 after bending is prone to overlapping, which may affect misalignment, thereby leading to a risk of hidden cracks in the photovoltaic module. When the angle is greater than 25°, since the inclination angle of the bending section 32 relative to the connecting section 31 is larger, the bending section 32 is prone to intersection with an extension direction of the connecting section 31 of an adjacent solder strip 3, to contact the adjacent solder strip 3 after folding, thereby resulting in a possibility of short circuit, which affects the quality of the photovoltaic module. Therefore, in the solution provided in some embodiments of the present disclosure, the angle between the extension direction of the bending section 32 and the extension direction of the connecting section 31 ranges from 5° to 25°, so that a possibility of contact between adjacent solder strips 3 can be reduced while the solder strip 3 can be misaligned after folding, to improve the quality of the photovoltaic module, which is more in line with an actual usage requirement.

In some embodiments, in the solution provided in some embodiments of the present disclosure, since the bending section 32 is inclined relative to the connecting section 31, in order to facilitate the connection of the bus bar 2 to the solder strip 3, the bus bar 2 may be moved by 0.2 mm to 5 mm along an inclination direction of the bending section 32 on the basis of the original. Generally, the bus bar 2 is configured to connect two adjacent cell strings, and a center of the bus bar 2 passes through the middle of two adjacent cell strings. For example, a space between two adjacent cell strings is m, a straight line l is located between the two adjacent cell strings, and a distance between the straight line l and either of the two adjacent cell strings is 0.5 m. When the solder strip 3 is not misaligned, that is, the bending section 32 and the connecting section 31 are parallel to each other and in a same straight line, the center of the bus bar 2 configured to connect the two cell strings is generally located at the straight line l. After the solder strip 3 is misaligned, that is, after an angle is formed between the extension direction of the bending section 32 and the extension direction of the connecting section 31, the bus bar 2 may be moved by a distance in the inclination direction of the bending section 32. The distance may range from 0.2 mm to 5 mm. That is, a distance between the center of the bus bar 2 and the straight line l ranges from 0.2 mm to 5 mm. According to an actual requirement, the distance may be 0.2 mm, 0.6 mm, 1.0 mm, 1.4 mm, 1.8 mm, 2.2 mm, 2.6 mm, 3.0 mm, 3.4 mm, 3.8 mm, 4.2 mm, 4.6 mm, 5.0 mm, or the like. As shown in FIG. 2, in some embodiments, prior to bending, a distance between an end position at an end of the bending section 32 of the solder strip 3 configured to be connected to the bus bar 2 and the extension direction of the connecting section 31 is L3. The distance L3 may be the same as the distance between the center of the bus bar and the straight line l. That is, 0.2 mm≤L3≤5 mm.

Through this design, the connection between the solder strip 3 and the bus bar 2 can be facilitated, which reduces a possibility that the solder strip 3 cannot be connected to the bus bar 2 or a contact area thereof is reduced after the bending section 32 of the solder strip 3 at an edge is inclined relative to the connecting section 31, which affects stability of the connection between the solder strip 3 and the bus bar 2.

As shown in FIG. 2, in some embodiments, the cell 1 may include a plurality of solder spots 4. The solder spots 4 include a first solder spot 41 and a second solder spot 42. The solder spots 4 are arranged along the length direction X of the photovoltaic module. Along the length direction X of the photovoltaic module, the solder spot 4 closest to the bus bar 2 is the first solder spot 41, and the other solder spot(s) 4 is the second solder spot 42. Generally, the first solder spot 41 is the solder spot 4 of the cell 1 that is closest to an edge of the cell string along the length direction X of the photovoltaic module. The connecting section 31 and the bending section 32 are located at two opposite sides of the first solder spot 41. That is, the connecting section 31 and the bending section 32 may be positioned by the first solder spot 41. The solder strip 3 at a side of the first solder spot 41 facing the edge of the cell string is the bending section 32, and the solder strip 3 at the other side is the connecting section 31. It is to be noted herein that the solder strip 3 is a complete solder strip 3 and passes through the first solder spot 41, and the bending section 32 and the connecting section 31 are connected together and does not break at the first solder spot 41. The bending section 32 may include a first bending section 321 and a second bending section 322 connected to each other, the first bending section 321 is configured to be connected to the connecting section 31, and the second bending section 322 is configured to be connected to the bus bar 2. When folding, the second bending section 322 is bent towards the side where the back surface of the cell 1 is located. After folding, the second bending section 322 is located at a side of the first bending section 321 facing the bus bar 2.

The first bending section 321 may serve as a transition section between the connecting section 31 and the second bending section 322. When folding, a bending position may be located between the first bending section 321 and the second bending section 322. Through this design, the bus bar 2 can be located at the back side of the cell 1 and connected to the cell 1 through the solder strip 3, thereby reducing the space occupied by the bus bar 2 in the length direction X of the photovoltaic module to help to increase the area proportion of the cell 1 and improve efficiency of the photovoltaic module.

Figure 6:
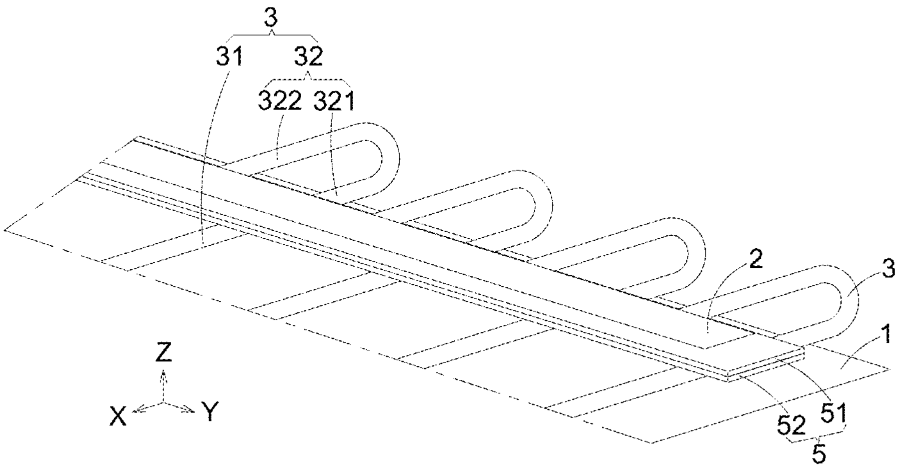
FIG. 6 is a schematic partial view of a photovoltaic module according to some embodiments of the present disclosure.
Figure 7:
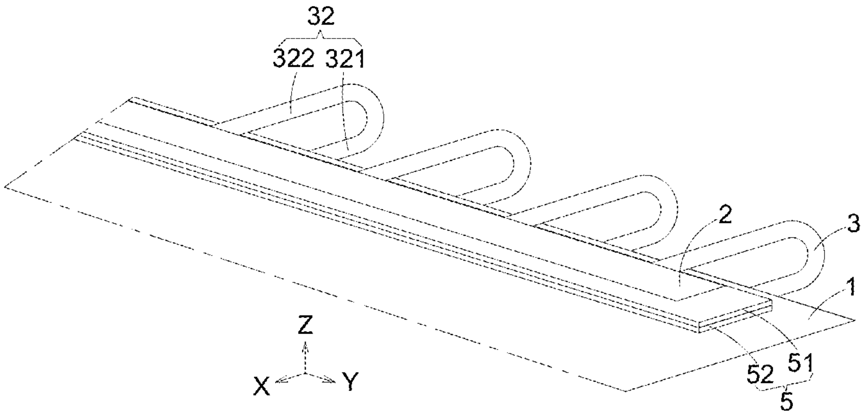
FIG. 7 is a schematic partial view of a photovoltaic module according to some embodiments of the present disclosure.

As shown in FIG. 6 and FIG. 7, in some embodiments, the connecting section 31 and the second bending section 322 of a same solder strip 3 are located at a same side of the cell string, or the connecting section 31 and the second bending section 322 of a same solder strip 3 are located at different sides of the cell string. That is, the connecting section 31 and the second bending section 322 of a same solder strip 3 may be located at a same side or different sides of the cell string.

In the solution provided in some embodiments of the present disclosure, the solder strip 3 configured to connect the bus bar 2 and the cell 1 of the cell string may be led out from a front surface of the cell 1 or led out from a back surface of the cell 1. That is, the connecting section 31 may be located at the front surface of the cell 1 or located at the back surface of the cell 1. When the connecting section 31 is located at the front surface of the cell 1, after folding, the second bending section 322 and the connecting section 31 are located at two opposite sides of the cell 1. When the connecting section 31 is located at the back surface of the cell 1, after folding, the second bending section 322 and the connecting section 31 are located at a same side of the cell 1.

In the solution provided in some embodiments of the present disclosure, according to the structure of the cell string, the solder strip 3 configured to connect the bus bar 2 may be arranged at the front surface or the back surface of the cell 1 according to an actual requirement, thereby helping to reduce a possibility of interference of the solder strip 3 with the structure of the cell string and reduce a possibility of short circuit or the like. When the solder strip 3 is led out from the front surface of the cell 1 and the solder strip 3 is bent towards the back surface of the cell 1, the thickness of the cell 1 needs to be taken into account. Therefore, generally, the solder strip 3 led out from the front surface of the cell 1 may be 0.2 mm to 2 mm (for example, 0.2 mm, 0.4 mm, 0.6 mm, 0.8 mm, 1.0 mm, 1.2 mm, 1.4 mm, 1.6 mm, 1.8 mm, 2.0 mm, or the like) longer than the solder strip 3 led out from the back surface of the cell 1.

As shown in FIG. 1, in some embodiments, in two cell strings connected to a same bus bar 2, for two cells 1 configured to be connected to the bus bar 2, according to a layout requirement of the photovoltaic module, a solder strip 3 may be led out from the front surface of one cell 1 while a solder strip 3 may be led out from the back surface of the other cell 1. The solution provided in some embodiments of the present disclosure may be applied to the structure in which the solder strip 3 is led out from the front surface of the cell 1 and also applied to the structure in which the solder strip 3 is led out from the back surface of the cell 1, which is more flexible in practical applications, can adapt to cell strings having different structures, and is more in line with an actual usage requirement.

Figure 8:
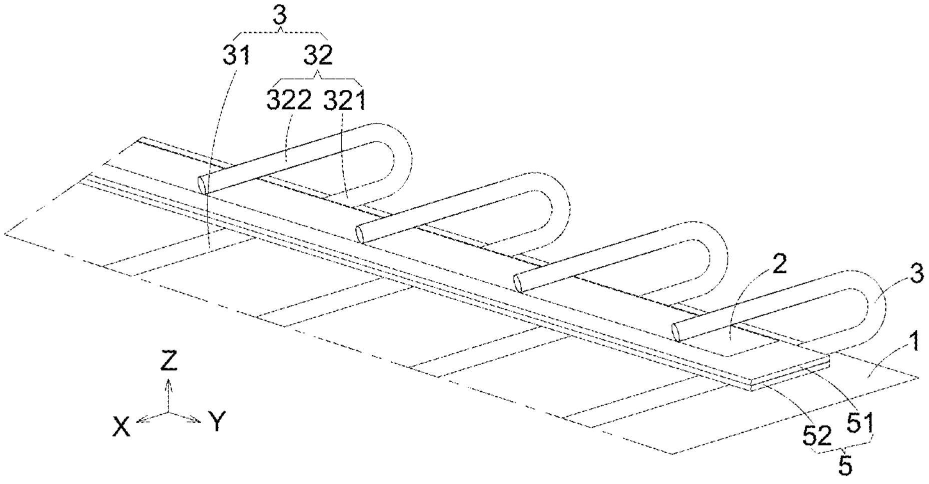
FIG. 8 is a schematic partial view of a photovoltaic module according to some embodiments of the present disclosure.

As shown in FIG. 6, in some embodiments, along the thickness direction Z of the photovoltaic module, the second bending section 322 is located at a side of the bus bar 2 facing the cell string; or as shown in FIG. 8, in some other embodiments, along the thickness direction Z of the photovoltaic module, the second bending section 322 is located at a side of the bus bar 2 away from the cell string.

In actual use, the solder strips 3 may be connected to different sides of the bus bar 2 according to requirements, to reduce soldering difficulty and facilitate folding. This design helps to improve the quality of soldering and can also reduce difficulty of processing, making it more in line with an actual usage requirement.

In some embodiments, the second bending sections 322 of the solder strips 3 connected to a same cell 1 are located at the side of the bus bar 2 facing the cell string; or along the thickness direction Z of the photovoltaic module, the second bending sections 322 of the solder strips 3 connected to a same cell 1 are located at the side of the bus bar 2 away from the cell string. That is, the solder strips 3 for connecting a same cell 1 and the bus bar 2 have a same connection structure.

In some embodiments, the solder strip 3 led out from the front surface of the cell 1 may be connected to a side of the bus bar 2 away from the cell string after folding, and the solder strip 3 led out from the back surface of the cell 1 may be connected to a side of the folded bus bar 2 facing the cell string after folding.

When a manner of first soldering and then folding is adopted, through this design, the sides of the solder strip 3 and the bus bar 2 that are close to each other can be soldered when soldering, which is conducive to reducing the difficulty of soldering. At the same time, this design can facilitate directly determining from a connection position of the solder strip 3 and the bus bar 2 whether the solder strip 3 is led out from the front surface of the cell 1 or the back surface of the cell 1 during subsequent processing and usage, which is more convenient during practical applications. Moreover, this design enables the second bending sections 322 to be distributed at two opposite sides of the bus bar 2, so that a distance between adjacent second bending sections 322 can be increased to reduce a possibility of short circuit or the like caused by contact between the adjacent second bending sections 322, which is more in line with an actual usage requirement.

In some embodiments, the type of the photovoltaic module may be a back contact module (BC module), and the cell 1 may be a back contact cell (BC cell). When the cell 1 is the BC cell, the connecting section 31 of the solder strip 3 is arranged at the back surface of the cell 1, and at the same time, the bending section 32 is bent towards the back surface of the cell 1, and the connecting section 31 and the bending section 32 are located at a same side of the cell. When the photovoltaic module is of a type other than the BC module, for example, the cell 1 may be a tunnel oxide passivated contact (TOPCon) cell. Each connecting section 31 may be led out from the front surface of the cell 1 or led out from the back surface of the cell 1 according to actual requirements. In some embodiments, the solder strips 3 of adjacent cell strings are led out from different directions. For example, two adjacent cell strings are a first cell string and a second cell string, in this case, the solder strip 3 located at the first cell string is led out from the front surface of the cell 1 and connected to the bus bar 2, and the solder strip 3 located at the second cell string is led out from the back surface of the cell 1 and connected to the bus bar 2.

Figure 9:
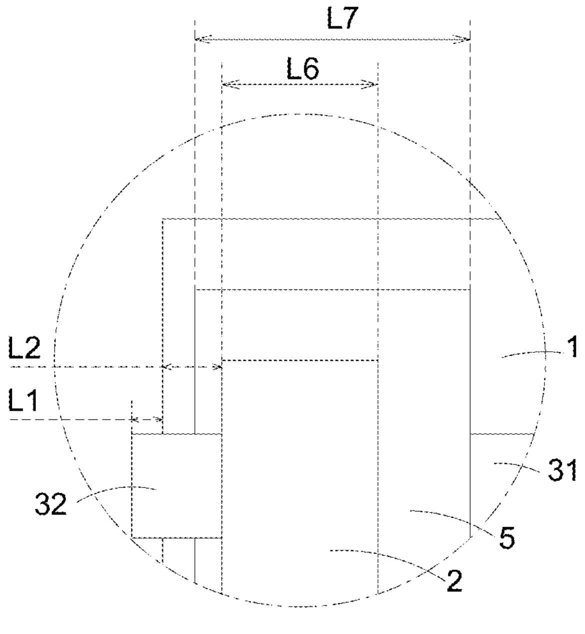
FIG. 9 is a partial enlarged view of Part I shown in FIG. 1.

As shown in FIG. 9, in some embodiments, along the length direction X of the photovoltaic module, at least part of the bending section 32 exceeds an edge of the cell string by a distance L1, and 0.1 mm≤L1≤2 mm. In the projection along the thickness direction Z of the photovoltaic module, the connection between the first bending section 321 and the second bending section 322 is located outside a projection range of the cell 1, and the excess distance L1 may be 0.1 mm, 0.3 mm, 0.5 mm, 0.7 mm, 0.9 mm, 1.1 mm, 1.3 mm, 1.5 mm, 1.7 mm, 1.9 mm, 2.0 mm, or the like.

Through this design, it may be easy to bend the solder strip 3. When the excess distance is less than 0.1 mm, it is more difficult to bend the solder strip 3, which is not conducive to actual manufacturing and processing. When the excess distance is greater than 2 mm, the solder strip 3 exceeds by a larger distance and may occupy a larger space in the length direction X of the photovoltaic module, thereby affecting layout of the cell 1 and affecting an area proportion of the cell 1. Therefore, in the solution provided in the embodiments of the present disclosure, after folding, the distance L1 by which the solder strip 3 exceeds the edge of the cell string ranges from 0.1 mm to 2 mm, which can reduce the difficulty of bending of the solder strip 3 and can also reduce the space occupied by the part of the solder strip 3 exceeding the edge of the cell string, thereby helping to optimize layout of the cell 1 and increasing the area proportion of the cell 1, so that the photovoltaic module can have a larger area to absorb light, thus helping to improve efficiency of the photovoltaic module.

As shown in FIG. 9, in some embodiments, along the length direction X of the photovoltaic module, the bus bar 2 does not exceed the edge of the cell string.

Through this design, all the bus bar 2 can be entirely arranged at the back side of the cell string, so that when calculating a dimension along the length direction X of the photovoltaic module, a dimension of the bus bar 2 can be ignored. Therefore, more cells 1 and/or larger cells 1 can be arranged without changing an overall length of the photovoltaic module, thereby helping to increase the area proportion of the battery 1 to help improve the efficiency of the photovoltaic module, which is more in line with an actual usage requirement.

As shown in FIG. 6, in some embodiments, the photovoltaic module further includes an isolation member 5, which is located between the bus bar 2 and the cell 1 in the thickness direction Z of the photovoltaic module.

The isolation member 5 may achieve effects of insulation and cushioning, and is arranged between the bus bar 2 and the cell 1 to reduce a possibility of short circuit or the like caused by excess contact between the bus bar 2, the solder strip 3, and the cell 1. The isolation member 5 may be made of a PET film, a PI film, or the like. During the lamination of the photovoltaic module, the isolation member 5 may also achieve effects of shock absorption and cushioning, which is configured to absorb force, thereby helping to reduce a possibility of hidden cracks in the photovoltaic module and being more in line with an actual usage requirement.

As shown in FIG. 6, in some embodiments, the isolation member 5 may include an insulating portion 51 and a cushioning portion 52. The insulating portion 51 mainly achieves an effect of insulation to reduce a possibility of excess contact between the bus bar 2, the solder strip 3, and the cell 1. The cushioning portion 52 is mainly configured for shock absorption and cushioning, to reduce a possibility of hidden cracks in the photovoltaic module during the lamination. The insulating portion 51 and the cushioning portion 52 may have an integrated structure or a split structure. When the cushioning portion 52 and the insulating portion 51 have a split structure, the cushioning portion 52 and the insulating portion 51 may be connected by hot melting. The cushioning portion 52 may be made of an adhesive film with good shock absorption and cushioning properties such as an EVA adhesive film.

As shown in FIG. 6, in some embodiments, the insulating portion 51 is located at a side of the cushioning portion 52 facing the bus bar 2.

This design can help improve an insulation effect of the isolation member 5. The insulating portion 51 is located at a side of the isolation member 5 closer to the bus bar 2, which can reduce a distance between the insulating portion 51 and the bus bar 2, so that the insulating portion 51 can better fit and contact the bus bar 2, thereby helping to improve the insulation effect of the isolation member 5, reducing a possibility of excess contact between other components and the bus bar 2, and being more in line with an actual usage requirement.

As shown in FIG. 9, in some embodiments, a width of the isolation member 5 is L7, a width of the bus bar 2 is L6, and a relationship between L7 and L6 satisfies L7−L6≥1 mm. By making the width of the isolation member 5 at least 1 mm larger than the width of the bus bar, the bus bar 2 can be entirely located within the range of the isolation member 5 during the arrangement, so that better insulation and cushioning effects can be achieved, which helps to reduce a possibility of excess contact of the bus bar 2 with other components, thereby helping to reduce a possibility of short circuit or the like to improve the quality of the photovoltaic module and be more in line with an actual usage requirement.

In some embodiments, the isolation member 5 has a width ranging from 4 mm to 20 mm and a thickness ranging from 0.05 mm to 5 mm. The width and the thickness of the isolation member 5 may be selected according to actual requirements. The width of the isolation member 5 may be 4 mm, 6 mm, 8 mm, 10 mm, 12 mm, 14 mm, 16 mm, 18 mm, 20 mm, or the like. The thickness of the isolation member 5 may be 0.05 mm, 1.0 mm, 1.5 mm, 2.0 mm, 2.5 mm, 3.0 mm, 3.5 mm, 4.0 mm, 4.5 mm, 5 mm, or the like. A length of the isolation member 5 may be set according to a length of the bus bar 2, which may be as long as the bus bar 2 or slightly longer than the bus bar 2, may generally be about 0.5 mm longer than the bus bar 2, and may be, for example, 0.5 mm, 0.7 mm, 0.9 mm, 1.1 mm, 1.3 mm, 1.5 mm longer than the bus bar 2. Through this design, requirements for accuracy of relative positions of the bus bar 2 and the isolation member 5 can be reduced, then there can be a certain fault-tolerant space, and it is more convenient to arrange the bus bar 2 within the range of the isolation member 5, thereby helping to improve the insulation and cushioning effects of the isolation member 5.

In some embodiments, the bus bar 2 has a width ranging from 3 mm to 15 mm and a thickness ranging from 0.1 mm to 0.4 mm. The width and the thickness of the bus bar 2 may be selected according to an actual requirement. The width of the bus bar 2 may be 3 mm, 4 mm, 5 mm, 6 mm, 7 mm, 8 mm, 9 mm, 10 mm, 11 mm, 12 mm, 13 mm, 14 mm, 15 mm, or the like. The thickness of the bus bar 2 may be 0.1 mm, 0.15 mm, 0.2 mm, 0.25 mm, 0.3 mm, 0.35 mm, 0.4 mm, or the like. The length of the bus bar 2 is affected by factors such as a dimension of the cell 1 of the cell string and a distance between adjacent cell strings, and an appropriate length can be selected according to an actual requirement.

In some embodiments, a projection of the bus bar 2 along the thickness direction Z of the photovoltaic module is located within a projection of the isolation member 5 along the thickness direction Z of the photovoltaic module.

Through this design, the insulation and cushioning effects of the isolation member 5 can be improved.

As shown in FIG. 9, in some embodiments, in the length direction X of the photovoltaic module, a space L2 is formed between the bus bar 2 and the edge of the cell string, and 0.1 mm≤L2≤3 mm. For example, the space between the bus bar 2 and the edge of the cell string may be 0.1 mm, 0.3 mm, 0.5 mm, 0.7 mm, 0.9 mm, 1.1 mm, 1.3 mm, 1.5 mm, 1.7 mm, 1.9 mm, 2.1 mm, 2.3 mm, 2.5 mm, 2.7 mm, 2.9 mm, 3.0 mm, or the like.

Through this design, a certain margin can be left between the bus bar 2 and the edge of the cell string, which can improve a fault tolerance and reduce the requirement for accuracy of relative positions of the bus bar 2 and the cell string. When a distance between the bus bar 2 and the edge of the cell string is less than 0.1 mm, during manufacturing, errors easily occur. As a result, the position between the bus bar 2 and the cell string is offset, causing the bus bar 2 to exceed the range of the cell string and occupy a certain space in the length direction X of the photovoltaic module, thereby affecting the layout of the cell 1. When the distance between the bus bar 2 and the edge of the cell string is greater than 3 mm, a distance of the bus bar 2 towards a center of the photovoltaic module is relatively large, which requires a larger size of the solder strip 3, thereby increasing the costs, easily causing excess contact of the solder strip with other components, increasing a risk of short circuit or the like, and affecting the quality of the cell 1.

Some embodiments of the present disclosure provide a photovoltaic module. The photovoltaic module includes a cell string, a bus bar 2, and at least one solder strip 3 configured to connect the bus bar 2 and a cell 1 of the cell string. Along a thickness direction Z of the photovoltaic module, the bus bar 2 is located at a side where a back surface of the cell 1 is located, and at least part of a projection of the bus bar 2 along the thickness direction Z of the photovoltaic module is located within a projection of the cell string along the thickness direction Z of the photovoltaic module. The solder strip 3 includes a connecting section 31 and a bending section 32, the connecting section 31 is connected to the cell 1, the bending section 32 bends towards a side where the back surface of the cell 1 is located and is connected to the bus bar 2, and an extension direction of the bending section 32 is not parallel to an extension direction of the connecting section 31. Through this design, the bus bar 2 can be arranged at a back side of the cell 1, which reduces a space occupied by the bus bar 2 in a length direction X of the photovoltaic module, thereby helping to improve an area proportion of the cell 1 and helping to improve efficiency of the photovoltaic module.

Figure 11:
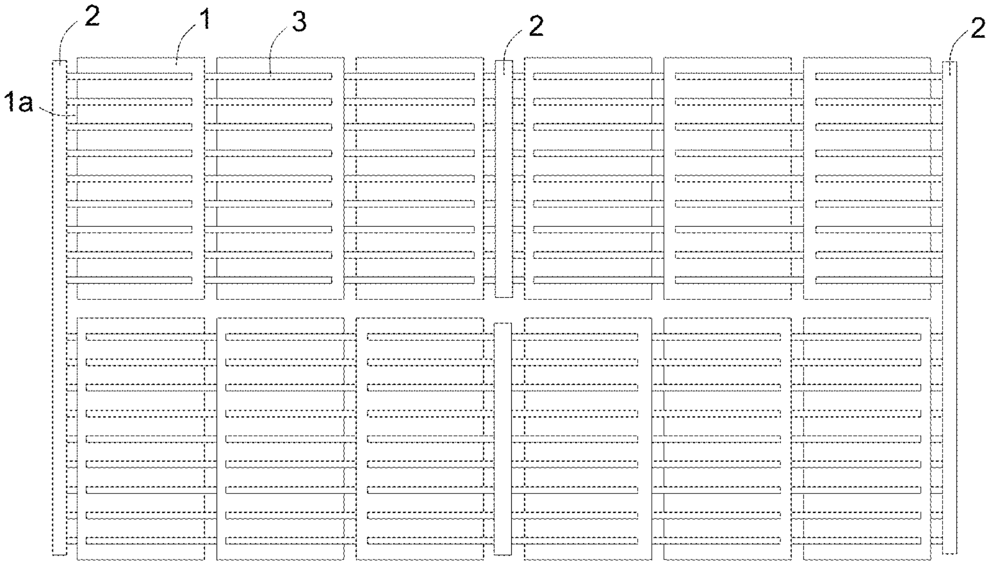
FIG. 11 is a schematic expanded view of a photovoltaic module according to some embodiments of the present disclosure.

Some embodiments of the present disclosure provide a method for forming a photovoltaic module. The method for forming the photovoltaic module is implemented through a processing system 6 for the photovoltaic module. The processing system 6 includes: a main body 61, a pick-and-place mechanism 62, and a flipping mechanism 63. As shown in FIG. 11, an edge of the cell string facing the bus bar 2 is defined as a first edge 1*a*.

Figure 10:
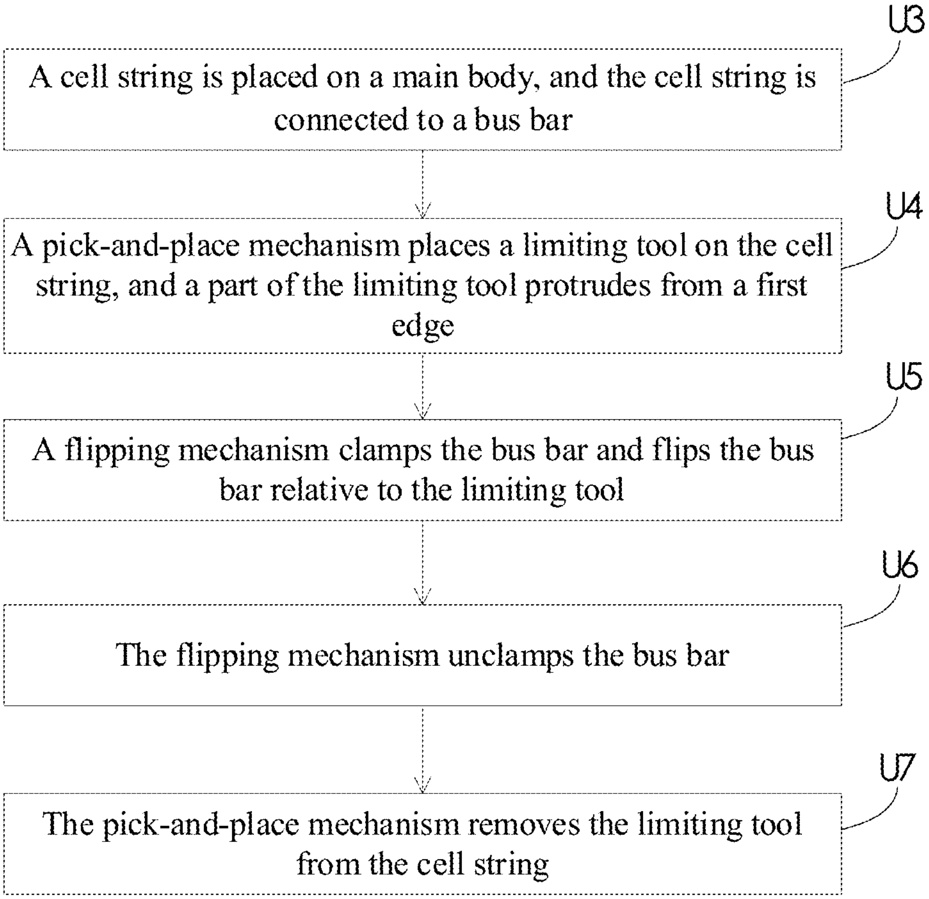
FIG. 10 is a flowchart of a method for forming a photovoltaic module according to some embodiments of the present disclosure.

As shown in FIG. 10, the method for forming the photovoltaic module includes the following steps.

In S1, a cell string is placed on the main body 61, and the cell string is connected to a bus bar 2.

In the step, as shown in FIG. 11, along an extension direction of the solder strip 3, the bus bar 2 is located at each of two sides of the cell string. The cell string is placed on the main body 61. The cell string is stationary relative to the main body 61, to facilitate processing of the cell string.

In S2, the pick-and-place mechanism 62 places a limiting tool 7 on the cell string, and a part of the limiting tool 7 protrudes from the first edge 1*a*.

In S3, the flipping mechanism 63 clamps the bus bar 2 and flips the bus bar 2 relative to the limiting tool 7.

Figure 12:
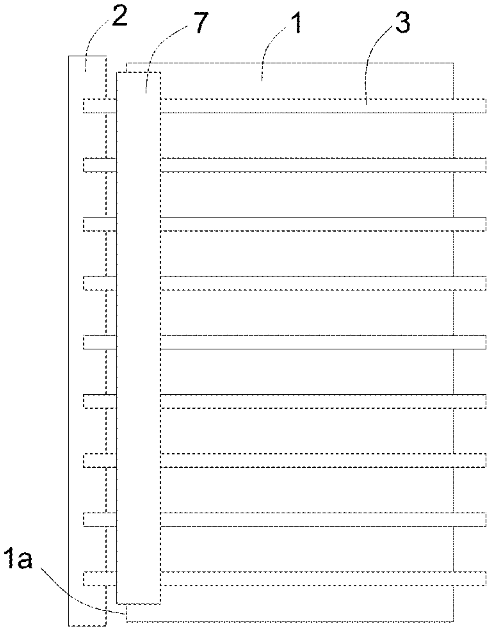
FIG. 12 is a schematic structural diagram of a limiting tool placed on a cell string.
Figure 13:
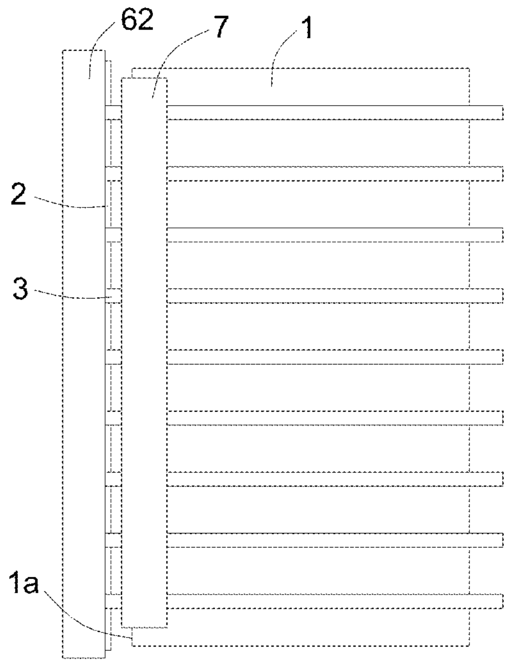
FIG. 13 is a schematic structural diagram of a flipping mechanism clamping a bus bar.

In step S2 and step S3, as shown in FIG. 12, the limiting tool 7 presses the cell 1 to achieve effects of limiting and fixing. As shown in FIG. 13, the flipping mechanism 63 tightly clamps the bus bar 2 and can drive the bus bar 2 to be flipped to a backlight surface of the cell 1. A part of the limiting tool 7 protrudes from the first edge 1*a*, so that during the flipping of the bus bar 2 to the backlight surface of the cell 1, the bus bar 2 does not contact the first edge 1*a*, thereby preventing damage to the cell 1 by the bus bar 2. An angle at which the bus bar 2 is flipped is 180° or approximately 180°.

For example, during the flipping of the bus bar 2 relative to the limiting tool 7, the part of the solder strip 3 pressed by the limiting tool 7 does not bend, so as to prevent hidden cracks at the edge of the cell 1 caused by contact between the solder strip 3 and the first edge 1*a* when the solder strip 3 at a light-receiving surface of the cell 1 is flipped together with the bus bar 2 to the backlight surface of the cell 1. Therefore, through the arrangement of the limiting tool 7, a manufacturing yield of the photovoltaic module can be improved, thereby preventing damage to the cell 1 during the processing.

In S4, the flipping mechanism 63 unclamps the bus bar 2.

In the step, after the flipping mechanism 63 unclamps the bus bar 2, the bus bar 2 remains positioned at the backlight surface of the cell 1. The flipping mechanism 63 may be a mechanical arm capable of clamping objects.

In S5, the pick-and-place mechanism 62 removes the limiting tool 7 from the cell string.

In such embodiments, as shown in FIG. 10, the processing system 6 can flip the bus bar 2 to the backlight surface of the cell 1 without damaging the cell 1 and increase the area proportion of the cell 1 in the photovoltaic module, thereby improving photoelectric conversion efficiency of the photovoltaic module. At the same time, the processing system 6 reduces steps that require manual operations, improves a degree of automation and manufacturing efficiency of manufacturing of the photovoltaic module, further improves consistency of the photovoltaic module manufactured, and reduces manufacturing errors caused by the manual operations.

Further, as shown in FIG. 6 to FIG. 8, in step S3 in which the flipping mechanism 63 clamps the bus bar 2 and flips the bus bar 2 relative to the limiting tool 7, at least part of the solder strip 3 protruding from the first edge 1*a* is bent into an arc shape, and the arc-shaped solder strip 3 does not have a sharp part and is not likely to cause damage to other part of the photovoltaic module. At the same time, the arc-shaped solder strip 3 can reduce an influence of bending of the solder strip 3 on reliability of the connection between the solder strip 3 and the cell 1 and reduce separation of the solder strip 3 from the cell 1.

Figure 14:
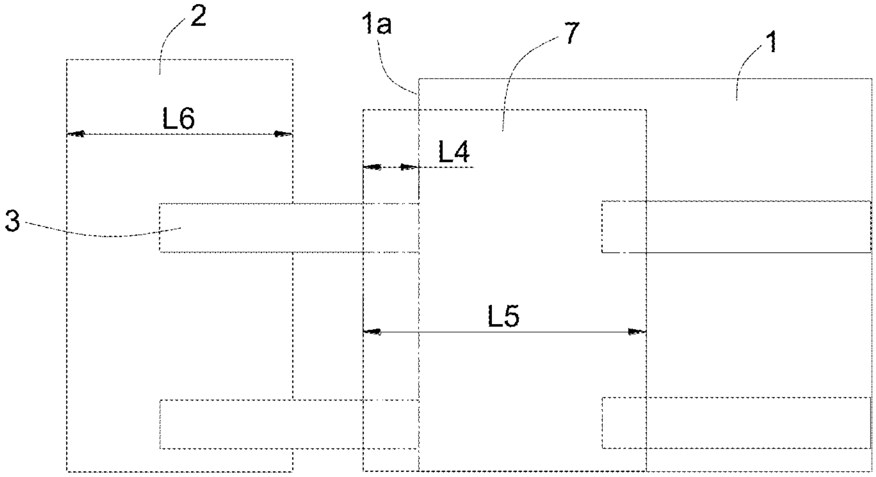
FIG. 14 is an enlarged view of a partial structure of a limiting tool placed on a cell string.

For example, as shown in FIG. 14, a length L4 by which the limiting tool 7 protrudes from the first edge 1*a* satisfies: 0.1 mm≤L4≤1.5 mm. For example, the length L4 by which the limiting tool 7 protrudes from the first edge 1*a* may be 0.1 mm, 0.2 mm, 0.3 mm, 0.5 mm, 0.8 mm, 0.9 mm, 1.0 mm, 1.2 mm, 1.5 mm, or the like.

The length L4 by which the limiting tool 7 protrudes from the first edge 1*a* should not be excessively large or excessively small. If the length L4 by which the limiting tool 7 protrudes from the first edge 1*a* is excessively small (e.g., less than 0.1 mm), contact between the solder strip 3 and the bus bar 2 with the first edge 1*a* cannot be effectively prevented when the solder strip 3 at the light-receiving surface of the cell 1 is flipped together with the bus bar 2 to the backlight surface of the cell 1, which easily causes hidden cracks in the cell 1. If the length L4 by which the limiting tool 7 protrudes from the first edge 1*a* is excessively large (i.e., greater than 1.5 mm), the area proportion of the cell 1 in the photovoltaic module can be reduced, and the photoelectric conversion efficiency of the photovoltaic module cannot be effectively improved. Therefore, the length L4 by which the limiting tool 7 protrudes from the first edge 1*a* should be selected within an appropriate range.

For example, as shown in FIG. 14, a width L5 of the limiting tool 7 satisfies: 4 mm≤L5≤18 mm. The width of the limiting tool 7 refers to a dimension of the limiting tool 7 in the extension direction of the solder strip 3. For example, the width L5 of the limiting tool 7 may be 4 mm, 5 mm, 8 mm, 10 mm, 12 mm, 15 mm, 17 mm, 18 mm, or the like.

The width L5 of the limiting tool 7 should not be excessively long or excessively short. If the width L5 of the limiting tool 7 is excessively short (e.g., shorter than 4 mm), the limiting tool 7 may easily shake relative to the cell 1 and it is difficult to achieve effects of limiting and fixing, and at the same time, it is difficult for the pick-and-place mechanism 62 to pick. If the width L5 of the limiting tool 7 is excessively long (e.g., longer than 18 mm), a weight of the limiting tool 7 is increased, and the difficulty of picking by the pick-and-place mechanism 62 may be increased. Therefore, the width L5 of the limiting tool 7 should be selected within an appropriate range.

For example, as shown in FIG. 14, a difference between the width L5 of the limiting tool 7 and the width L6 of the bus bar 2 satisfies: L5−L6≥1 mm. The width of the bus bar 2 refers to a dimension of the bus bar 2 in the extension direction of the solder strip 3. For example, the difference L5-L6 between the width L5 and the width L6 may be 1 mm, 1.2 mm, 1.3 mm, 1.5 mm, 1.8 mm, 2.0 mm, or the like.

The difference between the width L5 of the limiting tool 7 and the width L6 of the bus bar 2 should not be excessively small. If the difference L5-L6 is excessively small (i.e., less than 1 mm), the limiting tool 7 may not prevent contact between the bus bar 2 or the flipping mechanism 63 with the cell 1, and the cell 1 has a risk of hidden cracks. Therefore, the width L5 of the limiting tool 7 and the width L6 of the bus bar 2 should be selected within an appropriate range.

In some embodiments, the limiting tool 7 limits one cell string or a plurality of cell strings. When the limiting tool 7 limits only one cell string, the length of the limiting tool 7 is close to the length of one cell 1. When the limiting tool 7 limits a plurality of cell strings, the length of the limiting tool 7 is close to a total length of a plurality of cells 1 that are limited. The length of the limiting tool 7 refers to a dimension of the limiting tool 7 in a direction perpendicular to the extension direction of the solder strip 3. The length of the cell 1 refers to a dimension of the cell 1 in a direction perpendicular to the extension direction of the solder strip 3.

In some embodiments, the limiting tool 7 is a hard plastic plate.

Figure 15:
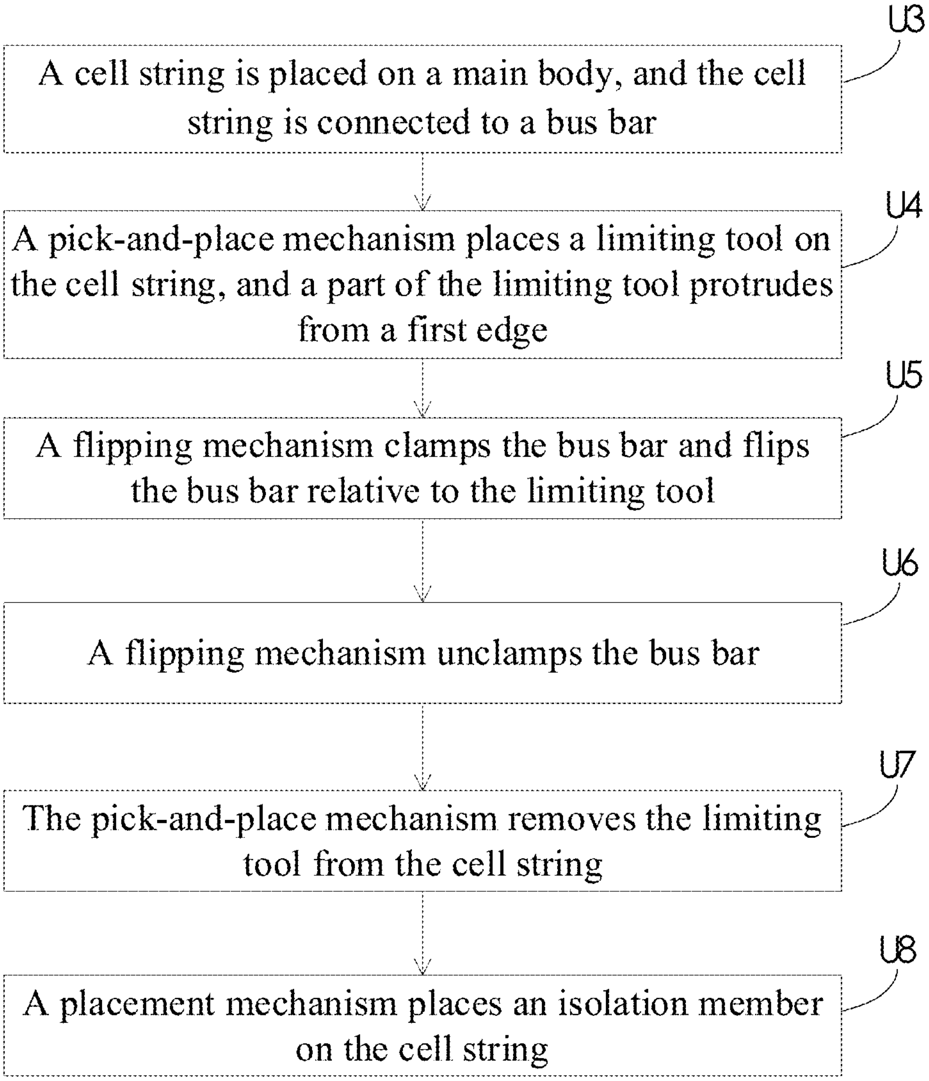
FIG. 15 is a flowchart of a method for forming a photovoltaic module according to some embodiments of the present disclosure.

In some embodiments, the processing system 6 further includes a placement mechanism 64. As shown in FIG. 15, subsequent to step S5 of removing, by the pick-and-place mechanism 62, the limiting tool 7 from the cell string, the method for forming the photovoltaic module further includes the following step.

In S6, the placement mechanism 64 places an isolation member 5 on the cell string, to enable the isolation member 5 to be located between the bus bar 2 and the cell string.

In the step, the isolation member 5 can separate the bus bar 2 from the cell 1. By placing the isolation member 5 by the placement mechanism 64, manual operations can be reduced, which improves a degree of automation and manufacturing efficiency of manufacturing of the photovoltaic module.

Figure 16:
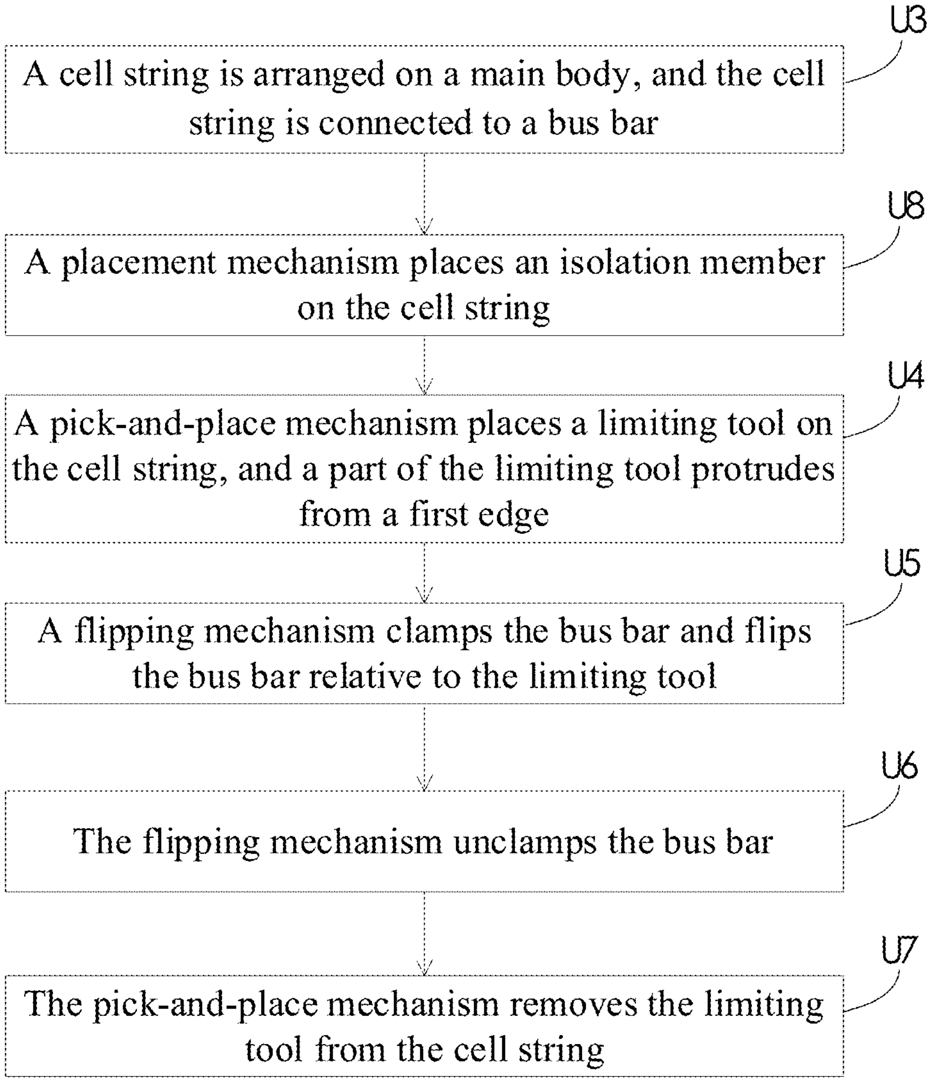
FIG. 16 is a flowchart of a method for forming a photovoltaic module according to some embodiments of the present disclosure.

In some other embodiments, as shown in FIG. 16, prior to step S2 of placing, by the pick-and-place mechanism 62, a limiting tool 7 on the cell string, the method for forming the photovoltaic module further includes the following step.

In S6, the placement mechanism 64 places an isolation member 5 on the cell string, to enable the isolation member 5 to be located between the bus bar 2 and the cell string.

In the step, the isolation member 5 may be placed first, and then the limiting tool 7 is placed, so that the isolation member 5 can further play a certain role in protecting the cell 1 during the flipping of the bus bar 2.

In some embodiments, the processing system 6 further includes a soldering mechanism, and in step S1 of placing the cell string on the main body 61, the cell string being connected to the bus bar 2, after the cell string is placed on the main body 61, the bus bar 2 may be placed at the head and tail of the cell string, and then the bus bar 2 is soldered at the head and tail of the cell string through the soldering mechanism. The soldering mechanism may perform soldering by any one of laser, infrared heating, and mechanical hot pressing.

Figure 17:
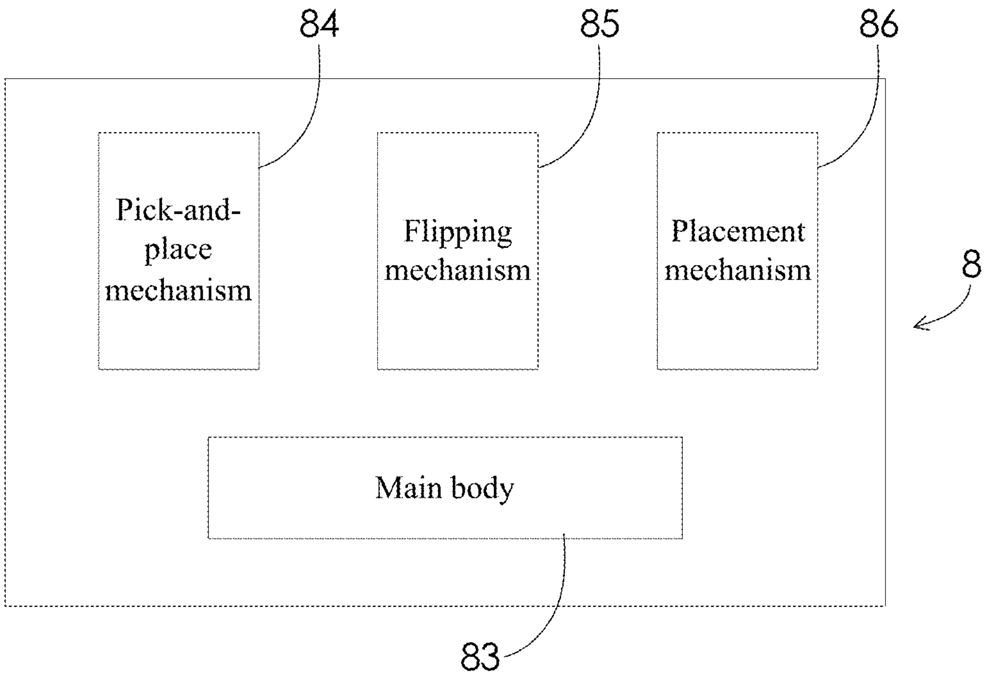
FIG. 17 is a schematic diagram of a processing system according to some embodiments of the present disclosure.

Some embodiments of the present disclosure provide a processing system 6 for a photovoltaic module. As shown in FIG. 17, the processing system 6 is configured for the method for forming the photovoltaic module described above, and the processing system 6 includes a main body 61, a pick-and-place mechanism 62, a flipping mechanism 63, a placement mechanism 64, and a control unit. The main body 61 is configured to place the cell string. The control unit controls the pick-and-place mechanism 62, the flipping mechanism 63, and the placement mechanism 64 to operate.

In such embodiments, as shown in FIG. 17, the pick-and-place mechanism 62, the flipping mechanism 63, and the placement mechanism 64 are arranged near the main body 61 to facilitate the operation on the cell string and the bus bar 2 on the main body 61. The pick-and-place mechanism 62, the flipping mechanism 63, and the placement mechanism 64 are all connected to the control unit, and the control unit controls the pick-and-place mechanism 62, the flipping mechanism 63, and the placement mechanism 64 to operate in an orderly manner, so that manufacturing efficiency of the photovoltaic module is higher.

The pick-and-place mechanism 62 is a mechanical arm having a clamping claw or another structure capable of implementing a pick-and-place operation. The flipping mechanism 63 is a structure capable of clamping the bus bar 2 and driving the bus bar 2 to be flipped. The placement mechanism 64 is a mechanical arm having a clamping claw or other structure capable of implementing a placement operation.

Further, since the pick-and-place mechanism 62 and the placement mechanism 64 have similar operations, they can be simplified to be formed as one mechanism. For example, the pick-and-place mechanism 62 can realize three operations: placing the limiting tool 7 on the cell string, removing the limiting tool 7 from the cell string, and placing the isolation member 5 on the cell string.

In addition, when the bus bar 2 needs to be soldered to the head and tail of the cell string, the processing system 6 further includes a soldering mechanism. The soldering mechanism is also connected to the control unit, and the control unit can control operation of the soldering mechanism.

The above descriptions are only preferred embodiments of the present disclosure and are not intended to limit the present disclosure. For those skilled in the art, the present disclosure may have various modifications and changes. Any modifications, equivalent replacements, improvements, and the like made within the concept of the present disclosure shall fall within a protection scope of the present disclosure.

Unless otherwise expressly indicated herein, all numerical values indicating mechanical/thermal properties, compositional percentages, dimensions and/or tolerances, or other characteristics are to be understood as modified by the word “about” or “approximately” in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean “at least one of A, at least one of B, and at least one of C.” The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A photovoltaic module, comprising:

a cell string comprising a cell;

a bus bar; and at least one solder strip configured to connect the cell to the bus bar, wherein along a thickness direction of the photovoltaic module, the bus bar is located at a side where a back surface of the cell is located; and at least part of a projection of the bus bar along the thickness direction of the photovoltaic module is located within a projection of the cell string along the thickness direction of the photovoltaic module; and the at least one solder strip comprises a connecting section and a bending section connected to each other, the connecting section is connected to the cell, the bending section bends towards the side where the back surface of the cell is located and is connected to the bus bar, and an extension direction of the bending section is not parallel to an extension direction of the connecting section, a non-zero angle is defined in a plane parallel to the cell and refers to an angle between the extension direction of the bending section and the extension direction of the connecting section before the bending section bends, and wherein the cell comprises a plurality of solder spots, and along a length direction of the photovoltaic module, a solder spot closest to the bus bar is defined as a first solder spot, wherein the bending section comprises a first bending section and a second bending section connected to each other, the first bending section is connected to the connecting section, and the second bending section is connected to the bus bar, and the connecting section and the first bending section are located at two opposite sides of the first solder spot.

2. The photovoltaic module according to claim 1, wherein the angle ranges from 5° to 25°.

3. The photovoltaic module according to claim 1, wherein the bending section is inclined relative to the connecting section; and the bus bar is misaligned, along an inclination direction of the bending section, by 0.2 mm to 5 mm from a position where the bus bar is aligned with the connecting section connected to the cell.

4. The photovoltaic module according to claim 1, wherein the cell of the cell string is led out from a front surface of the cell or led out from a back surface of the cell.

5. The photovoltaic module according to claim 4, for two adjacent cell strings, a solder strip of one cell string is led out from the front surface of the cell and a solder strip of the other one cell string is led out from the back surface of the cell.

6. The photovoltaic module according to claim 4, wherein the connecting section and the second bending section of a same solder strip are located at a same side of the cell string; or the connecting section and the second bending section of a same solder strip are located at different sides of the cell string.

7. The photovoltaic module according to claim 6, wherein a solder strip led out from the front surface of the cell is 0.2 mm to 2 mm longer than a solder strip led out from the back surface of the cell.

8. The photovoltaic module according to claim 1, wherein along the thickness direction of the photovoltaic module, the second bending section is located at a side of the bus bar facing the cell string; or along the thickness direction of the photovoltaic module, the second bending section is located at a side of the bus bar away from the cell string.

9. The photovoltaic module according to claim 1, wherein along a length direction of the photovoltaic module, at least part of the bending section exceeds an edge of the cell string by a distance L1 ranging from 0.1 mm to 2 mm.

10. The photovoltaic module according to claim 1, wherein along a length direction of the photovoltaic module, the bus bar does not exceed an edge of the cell string.

11. The photovoltaic module according to claim 1, further comprising an isolation member, wherein along the thickness direction of the photovoltaic module, the isolation member is located between the bus bar and the cell.

12. The photovoltaic module according to claim 11, wherein a width L7 of the isolation member is greater than a width L6 of the bus bar.

13. The photovoltaic module according to claim 11, wherein a width L7 of the isolation member satisfies: 4 mm≤L7≤20 mm.

14. The photovoltaic module according to claim 11, a width L7 of the isolation member and a width L6 of the bus bar satisfy L7−L6≥1 mm.

15. The photovoltaic module according to claim 11, wherein the isolation member is made of a Polyester film or a Polyimide film.

16. The photovoltaic module according to claim 11, wherein the isolation member comprises an insulating portion and a cushioning portion, and along the thickness direction of the photovoltaic module, the insulating portion and the cushioning portion are arranged in sequence.

17. The photovoltaic module according to claim 16, wherein the cushioning portion and the insulating portion are formed as an integrated structure.

18. The photovoltaic module according to claim 16, wherein the cushioning portion and the insulating portion are formed as a split structure, and are connected to each other by hot melting.

19. The photovoltaic module according to claim 16, wherein along the thickness direction of the photovoltaic module, the insulating portion is located at a side of the cushioning portion facing the bus bar.

* * * * *